United States Patent
Diep et al.

(10) Patent No.: US 12,308,074 B2
(45) Date of Patent: *May 20, 2025

(54) ENHANCED GRADIENT SEEDING SCHEME DURING A PROGRAM OPERATION IN A MEMORY SUB-SYSTEM

(71) Applicant: Micron Technology, Inc., Boise, ID (US)

(72) Inventors: Vinh Q. Diep, Hayward, CA (US); Ching-Huang Lu, Fremont, CA (US); Yingda Dong, Los Altos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/545,888

(22) Filed: Dec. 19, 2023

(65) Prior Publication Data

US 2024/0120010 A1    Apr. 11, 2024

Related U.S. Application Data

(63) Continuation of application No. 17/247,576, filed on Dec. 16, 2020, now Pat. No. 11,901,010.

(51) Int. Cl.
| | | |
|---|---|---|
| G11C 16/10 | (2006.01) | |
| G11C 16/08 | (2006.01) | |
| G11C 16/26 | (2006.01) | |
| G11C 16/30 | (2006.01) | |
| G11C 16/32 | (2006.01) | |

(52) U.S. Cl.
CPC ............ *G11C 16/10* (2013.01); *G11C 16/08* (2013.01); *G11C 16/26* (2013.01); *G11C 16/30* (2013.01); *G11C 16/32* (2013.01)

(58) Field of Classification Search
CPC ...................................................... G11C 16/10
See application file for complete search history.

(56) References Cited

U.S. PATENT DOCUMENTS

| | | |
|---|---|---|
| 7,020,026 B2 | 3/2006 | Guterman et al. |
| 7,839,688 B2 | 11/2010 | Kim |
| 8,929,134 B2 | 1/2015 | Liu et al. |
| 10,790,003 B1 | 9/2020 | Chen et al. |
| 2008/0186776 A1 | 8/2008 | Kim et al. |

(Continued)

*Primary Examiner* — Douglas King
(74) *Attorney, Agent, or Firm* — LOWENSTEIN SANDLER LLP

(57) ABSTRACT

Control logic in a memory device initiates a program operation on a memory array, the program operation comprising a seeding phase. During the seeding phase, the control logic causes a seeding voltage to be applied to a string of memory cells in a data block of the memory array during the seeding phase of the program operation and causes a first positive voltage to be applied to a first plurality of word lines of the data block during the seeding phase, wherein each of the first plurality of word lines is coupled to a corresponding memory cell of a first plurality of memory cells in the string of memory cells, the first plurality of word lines comprising a selected word line associated with the program operation. The control logic further causes a second positive voltage to be applied to one or more second word lines coupled to one or more second memory cells on a source-side of the first plurality of memory cells in the string of memory cells during the seeding phase, wherein the second positive voltage is less than the first positive voltage.

20 Claims, 7 Drawing Sheets

(56) References Cited

U.S. PATENT DOCUMENTS

| | | |
|---|---|---|
| 2009/0257280 A1 | 10/2009 | Oh et al. |
| 2011/0292725 A1 | 12/2011 | Choi et al. |
| 2016/0267004 A1 | 9/2016 | Perlstein et al. |
| 2017/0278579 A1 | 9/2017 | Lee et al. |
| 2021/0020254 A1 | 1/2021 | Kim et al. |

US 12,308,074 B2

ENHANCED GRADIENT SEEDING SCHEME DURING A PROGRAM OPERATION IN A MEMORY SUB-SYSTEM

RELATED APPLICATIONS

This application is a continuation of U.S. patent application Ser. No. 17/247,576, filed Dec. 16, 2020, the entire contents of which are hereby incorporated by reference herein.

TECHNICAL FIELD

Embodiments of the disclosure relate generally to memory sub-systems, and more specifically, relate to an enhanced gradient seeding scheme during a program operation in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
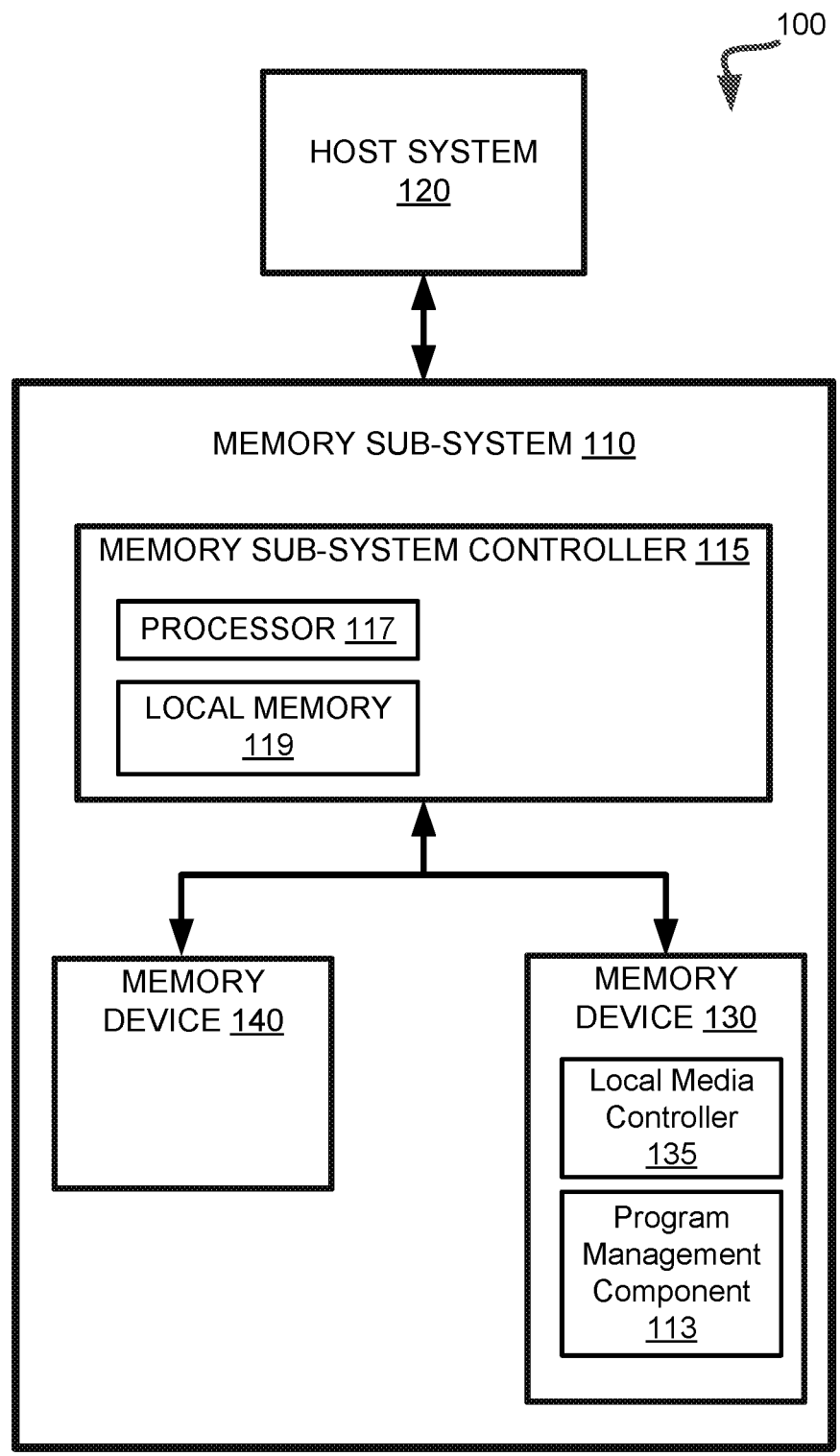
FIG. 1 illustrates an example computing system that includes a memory sub-system in accordance with some embodiments of the present disclosure.

Aspects of the present disclosure are directed to an enhanced gradient seeding scheme during a program operation in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more die, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. A data block hereinafter refers to a unit of the memory device used to store data and can include a group of memory cells, a word line group, a word line, or individual memory cells. Each data block can include a number of sub-blocks, where each sub-block is defined by a set of associated pillars (e.g., one or more vertical conductive traces) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "word lines," often fabricated in common with the memory cells, so as to form an array of strings in a block of memory. The compact nature of certain non-volatile memory devices, such as 3D flash NAND memory, means word lines are common to many memory cells within a block of memory.

During a programming operation, a selected memory cell(s) can be programmed with the application of a programming voltage to a selected word line. Due to the word line being common to multiple memory cells, unselected memory cells can be subject to the same programming voltage as the selected memory cell(s). If not otherwise preconditioned, the unselected memory cells can experience effects from the programming voltage on the common word line. These programming voltage effects can include the condition of charge being stored in the unselected memory cells which are expected to maintain stored data. This programming voltage effect is termed a "programming disturbance" or "program disturb" effect. The program disturb effect can render the charge stored in the unselected memory cells unreadable altogether or, although still apparently readable, the contents of the memory cell can be read as a data value different than the intended data value stored before application of the programming voltage.

The presence of residue electrons, such as electrons trapped or otherwise remaining inside the poly-silicon channel of a charge storage structure after an earlier operation (e.g., a previous program operation), can contribute to the program disturb effect. At the end of a program verify operation, for example, a pass voltage (Vpass) applied to the word lines that are not being programmed ramps down and word lines on the source side having a high threshold voltage will cut off prior to word lines with a lower threshold voltage. Therefore, electrons will be trapped inside the poly-silicon channel at the word lines with the lower threshold voltage (i.e., between the cut off word lines) and become residue electrons. Since the poly-silicon channel (i.e., the pillar channel region) in some non-volatile memory devices is a floating channel that may not be connected to a bulk grounded body, there is generally no path for residual electrons in the channel region to discharge other than through towards the source of the memory string. Some programming operations generally include a seeding phase where a seeding voltage (e.g., 2 volts) is applied on the string and a ground voltage (e.g., 0 volts) is applied to all of the word lines intersecting the string, including the selected word line. Using a ground voltage during the seeding phase causes the source side word lines to remain off and the residue electrons remain trapped on the source side of the selected word line at the end of the seeding phase. These residue electrons can contribute to program disturb in a number of ways. For example, when the pass voltage or a program voltage is ramped up in a subsequent program operation, the selected word line can suffer from hot-electron ("hot-e") disturb where a large voltage differential between the gate and source causes the residue electrons to be injected from a drain depletion region into the floating gate. In addition, this voltage differential can initiate an electrostatic field of sufficient magnitude to change the charge on the selected word line and cause the contents of the memory cell to be programmed inadvertently or read incorrectly. Furthermore, the electrostatic field can cause local electron-hole pair generation in the channel region, leading to even more electrons that can be injected into the selected word line.

Aspects of the present disclosure address the above and other deficiencies by implementing an enhanced gradient seeding scheme during a program operation in a memory sub-system. In one embodiment, control logic of a memory device in the memory sub-system initiates a program operation on the memory device, causes a seeding voltage to be applied to a string of memory cells in a data block of the memory device during a seeding phase of the program operation, and causes a first positive voltage to be applied to a first plurality of word lines of the data block during the seeding phase. Each of the first plurality of word lines is coupled to a corresponding memory cell of a first plurality of memory cells in the string, and the first plurality of word lines comprises a selected word line associated with the program operation. The control logic further causes a second positive voltage to be applied to one or more second word lines coupled to one or more second memory cells on a source-side of the first plurality of memory cells in the string of memory cells during the seeding phase. In one embodiment, this second positive voltage is less than the first positive voltage. Since the second positive voltage is less than the first positive voltage, there is a less abrupt potential gradient in the word lines going down the string away from the selected word line. This can reduce electron barriers at those memory cells coupled to the corresponding word lines, allowing any residue electrons trapped on the source side to flow past the barriers and to the drain side of the string. As a result, most, if not all, of the residue electrons can be purged from the channel of the string during the seeding phase, such that when a high program voltage is subsequently applied to the selected word line, the residue electrons are not present and are not injected into the selected word line.

In addition, at the end of the seeding phase the respective voltages applied to the various word lines are ramped down before the program voltage is applied. In one embodiment, the control logic ramps down the first positive voltage applied to the selected word line and at least one adjacent word line on the source-side to an intermediate voltage (i.e., less than the first positive voltage but greater than a ground voltage) while remaining word lines are ramped down all the way to the ground voltage. This prevents the channel from being cut off, and thereby preserves the residue electron flow from the channel to drain, and further reduces injection of those electrons into the selected word line during the subsequent program operation. Furthermore, the control logic can cause respective biasing voltages applied to word lines coupled to a select gate device and one or more inactive memory cells in the string to ramp down to the ground voltage after a delay period at the end of the seeding phase. In one embodiment, the delay period comprises a period of time after the first positive voltage has been ramped down to at least one of the intermediate voltage or the ground voltage. This prevents the channel potential from becoming negative and preserves the benefits obtained during the seeding phase. Accordingly, program disturb effects can be significantly reduced when using the techniques described herein, resulting in improved program performance for the memory device in the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory device 130 includes a memory device program management component 113 that can oversee, control, and/or manage data access operations, such as program operations, performed on a non-volatile memory device, such as memory device 130, of memory sub-system 110. A program operation, for example, can include a number of phases, such as a seeding phase, a pass voltage ramp up phase, a program voltage ramp up phase, and a program recovery phase. The program operation can be followed by a program verify operation, including a program verify phase and a program verify recovery phase, before a subsequent program operation is initiated. Program management component 113 is responsible for causing certain voltages to be applied (or indicating which voltages to apply) to memory device 130 during the program operation. In certain types of memory devices, such as devices configured with QLC memory, a multi-pass programming algorithm can be used. In the multi-pass programming algorithm, the memory cells of a selected string coupled to one or more word lines are programed to a coarse value initially in a first pass, and then subsequently programmed again to a more finely tuned value in a second pass. The seeding phase of such a program operation generally includes global boosting of channel voltages of inhibited strings (i.e., strings on which a memory cell is not being programmed) in the memory device 130 in an attempt to counter-act program disturb resulting from the use of high voltage program pulses. A seeding voltage applied to the string (e.g., on the bit line) causes the source, drain and channel of the string to couple at higher voltage levels, thus better inhibiting program disturb. Since relatively high voltages are applied during the program voltage ramp up phase, the program recovery phase allows the device to recover from the high voltage modes. In general, during the program recovery phase all signals are ramped down to some lower voltage level.

In one embodiment, program management component 113 causes a word line driver to apply a seeding voltage to a string of memory cells in a data block of the memory device 130 during the seeding phase of the program operation, and causes the word line driver to apply a series of positive voltages to the word lines of the data block during the seeding phase. Each of those word lines is coupled to a corresponding memory cell in the string. In one embodiment, a first number of those word lines are biased at a high bias voltage (e.g., 3-5V) to help turn on the corresponding memory cells during the seeding phase, so that trapped residue electrons can flow out of the channel. Those word lines can include at least one word line adjacent to the selected word line on the drain-side of the channel (i.e., the word line that was previously programmed with a coarse data pattern as part of the multi-pass programming algorithm. Failure to bias this word line could result in that coarse data pattern blocking the seeding on the string. In addition, program management component 113 can cause the word line driver to apply lower bias voltages to other word lines of the data block (i.e., those word lines adjacent to the word lines receiving the high bias voltage on a source-side of the memory string). These lower bias voltages can "step-down" (i.e., get progressively closer to a ground voltage as the word lines are further away from the selected word line) in order to smooth the potential gradient along the channel.

In addition, program management component 113 ramps the seeding voltage and the word line bias voltages down at the end of the seeding phase, before applying program voltages. In one embodiment, program management component 113 ramps down the high bias voltage applied to the selected word line and at least one adjacent word line on the source-side to an intermediate voltage (i.e., less than the first positive voltage but greater than a ground voltage) while remaining word lines are ramped down all the way to the ground voltage. This prevents the channel from being cut off, and thereby preserves the residue electron flow from the channel to drain, and further reduces injection of those electrons into the selected word line during the subsequent program operation. Furthermore, program management component 113 can cause respective biasing voltages applied to word lines coupled to a select gate device and one or more inactive memory cells in the string to ramp down to the ground voltage after a delay period at the end of the seeding phase. In one embodiment, the delay period comprises a period of time after the first positive voltage has been ramped down to at least one of the intermediate voltage or the ground voltage. Further details with regards to the operations of the program management component 113 are described below.

In some embodiments, the memory sub-system controller 115 includes at least a portion of program management component 113. For example, the memory sub-system controller 115 can include a processor 117 (e.g., a processing device) configured to execute instructions stored in local memory 119 for performing the operations described herein. In some embodiments, program management component 113 is part of the host system 110, an application, or an operating system. In other embodiment, local media controller 135 includes at least a portion of program management component 113 and is configured to perform the functionality described herein. In such an embodiment, program management component 113 can be implemented using hardware or as firmware, stored on memory device 130, executed by the control logic (e.g., program management component 113) to perform the operations related to the enhanced gradient seeding scheme described herein.

Figure 2A:
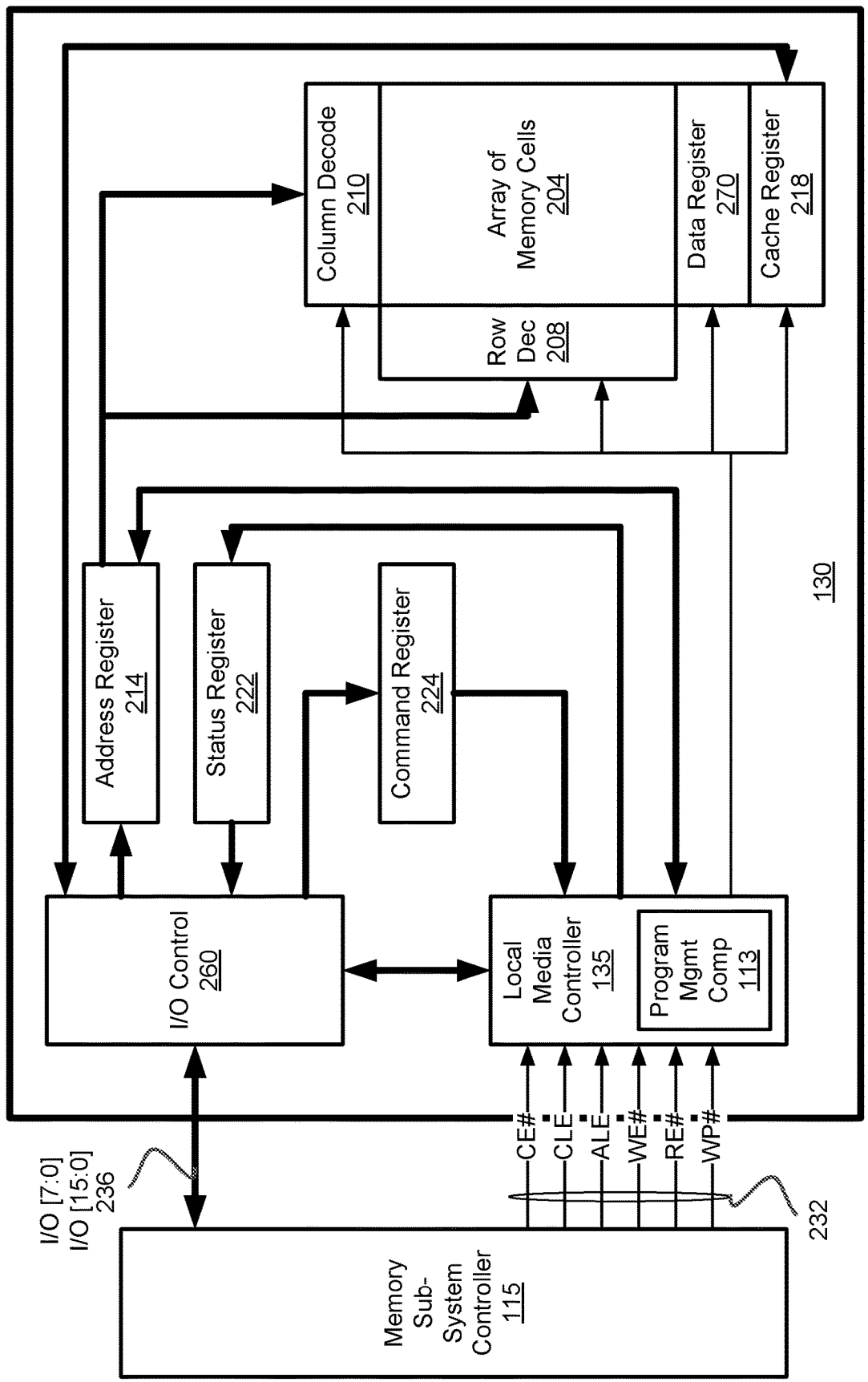
FIG. 2A is a block diagram of a memory device in communication with a memory sub-system controller of a memory sub-system, according to an embodiment.

FIG. 2A is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2A) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 260 to manage input of commands, addresses and data to the memory device 130 as well as output of data and status information from the memory device 130. An address register 214 is in communication with I/O control circuitry 260 and row decode circuitry 208 and column decode circuitry 210 to latch the address signals prior to decoding. A command register 224 is in communication with I/O control circuitry 260 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 134 includes program management component 113, which can implement the enhanced gradient seeding scheme described herein during a program operation on memory device 130.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 270 for transfer to the array of memory cells 204; then new data may be latched in the cache register 218 from the I/O control circuitry 260. During a read operation, data may be passed from the cache register 218 to the I/O control circuitry 260 for output to the memory sub-system controller 115; then new data may be passed from the data register 270 to the cache register 218. The cache register 218 and/or the data register 270 may form (e.g., may form a portion of) a page buffer of the memory device 130. A page buffer may further include sensing devices (not shown in FIG. 2A) to sense a data state of a memory cell of the array of memory cells 204, e.g., by sensing a state of a data line connected to that memory cell. A status register 222 may be in communication with I/O control circuitry 260 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 260 and may then be written into command register 224. The addresses may be received over input/output (I/O) pins [7:0] of I/O bus 236 at I/O control circuitry 260 and may then be written into address register 214. The data may be received over input/output (I/O) pins [7:0] for an 8-bit device or input/output (I/O) pins [15:0] for a 16-bit device at I/O control circuitry 260 and then may be written into cache register 218. The data may be subsequently written into data register 270 for programming the array of memory cells 204.

In an embodiment, cache register 218 may be omitted, and the data may be written directly into data register 270. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2A has been simplified. It should be recognized that the functionality of the various block components described with reference to FIG. 2A may not necessarily be segregated to distinct components or component portions of an integrated circuit device. For example, a single component or component portion of an integrated circuit device could be adapted to perform the functionality of more than one block component of FIG. 2A. Alternatively, one or more components or component portions of an integrated circuit device could be combined to perform the functionality of a single block component of FIG. 2A. Additionally, while specific I/O pins are described in accordance with popular conventions for receipt and output of the various signals, it is noted that other combinations or numbers of I/O pins (or other I/O node structures) may be used in the various embodiments.

Figure 2B:
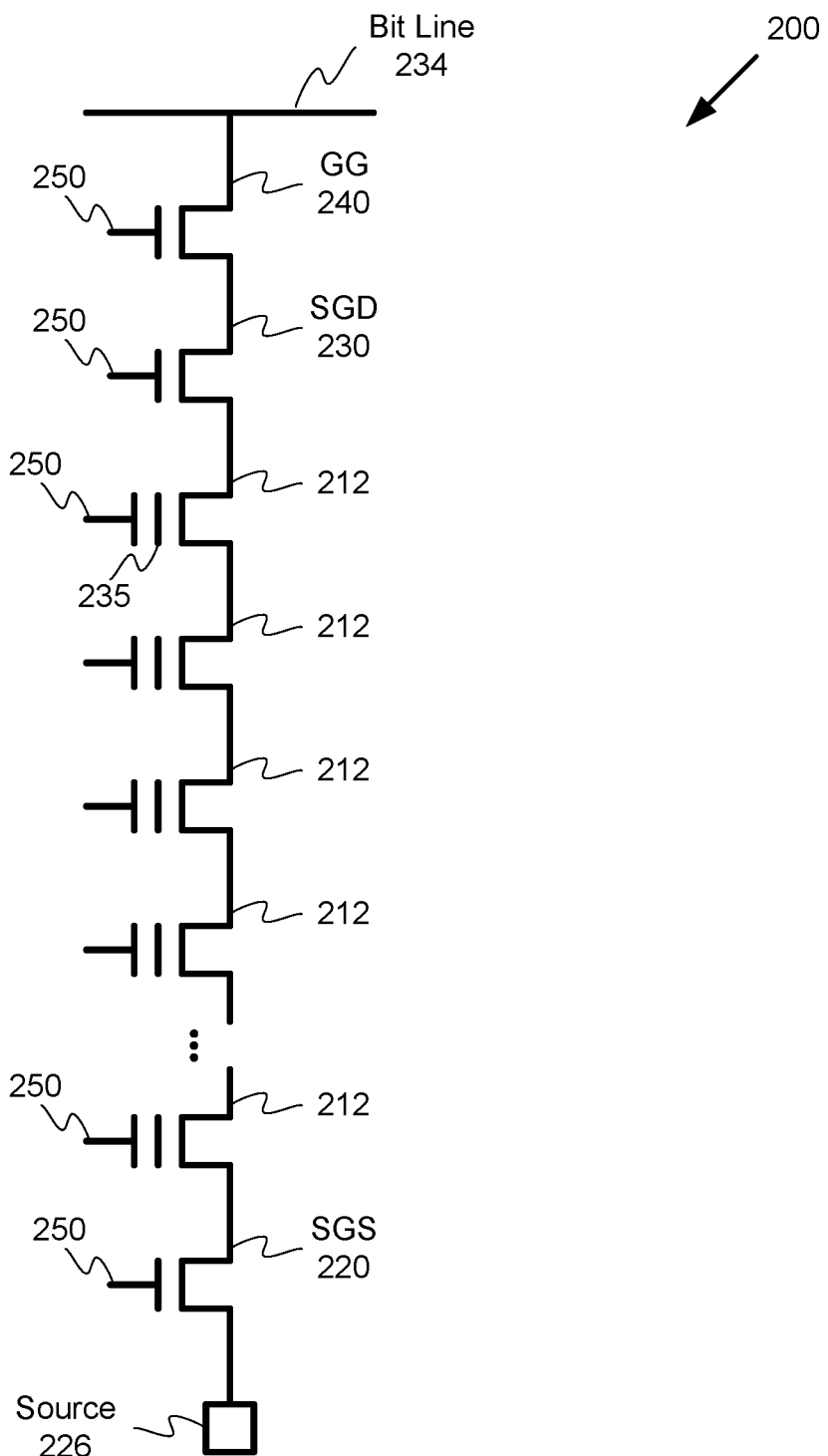
FIG. 2B is a schematic diagram illustrating a string of memory cells in a data block of a memory device in a memory sub-system in accordance with some embodiments of the present disclosure.

FIG. 2B is a schematic diagram illustrating a string 200 of memory cells in a data block of a memory device in a memory sub-system in accordance with some embodiments of the present disclosure. In one embodiment, the string 200 is representative of one portion of memory device 130, such as from array of memory cells 204, as shown in FIG. 2A. The string 200 includes a number of memory cells 212 (i.e., charge storage devices), such as up to 32 memory cells (or more) in some embodiments. The string 200 includes a source-side select transistor known as a source select gate 220 (SGS) (typically an n-channel transistor) coupled between a memory cell 212 at one end of the string 200 and a common source 226. The common source 226 may include, for example, a commonly doped semiconductor material and/or other conductive material. At the other end of the string 200, a drain-side select transistor called a drain select gate 230 (SGD) (typically an n-channel transistor) and a gate induced drain leakage (GIDL) generator 240 (GG) (typically an n-channel transistor) are coupled between one of the memory cells 212 and a data line 234, which is commonly referred to in the art as a "bit line." The common source 226 can be coupled to a reference voltage (e.g., ground voltage or simply "ground" [Gnd]) or a voltage source (e.g., a charge pump circuit or power supply which may be selectively configured to a particular voltage suitable for optimizing a programming operation, for example).

Each memory cell 212 may include, for example, a floating gate transistor or a charge trap transistor and may comprise a single level memory cell or a multilevel memory cell. The floating gate may be referred to as a charge storage structure 235. The memory cells 212, the source select gate 220, the drain select gate 230, and the GIDL generator 240 can be controlled by signals on their respective control gates 250.

The control signals can be applied by program management component 113, or at the direction of program management component 113, to select lines (not shown) to select strings, or to access lines (not shown) to select memory cells 212, for example. In some cases, the control gates can form a portion of the select lines (for select devices) or access lines (for cells). The drain select gate 230 receives a voltage that can cause the drain select gate 230 to select or deselect the string 200. In one embodiment, each respective control gate 250 is connected to a separate word line (i.e., access line), such that each device or memory cell can be separately controlled. The string 200 can be one of multiple strings of memory cells in a block of memory cells in memory device 130. For example, when multiple strings of memory cells are present, each memory cell 212 in string 200 may be connected to a corresponding shared word line, to which a corresponding memory cell in each of the multiple strings is also connected. As such, if a selected memory cell in one of those multiple strings is being programmed, a corresponding unselected memory cell 212 in string 200 which is connected to the same word line as the selected cell can be subjected to the same programming voltage, potentially leading to program disturb effects. Accordingly, in one embodiment, program management component 113 causes a word line driver to apply a seeding voltage to the bit line 234 during a seeding phase of the program operation, and causes two or more positive voltages to be applied to the word lines connected to certain control gates 250 of the devices and/or cells 212 in the string 200 during the seeding phase. As described herein, these voltages can include a high bias voltage and incrementally step-down to lower bias voltages depending on the word line to which they are applied. As a result, most, if not all, of the residue electrons can be purged from channel of the string 200 during the seeding phase, such that when a high program voltage is subsequently applied to the selected word line, the residue electrons are not present and are not injected be injected into the selected word line.

Figure 3:
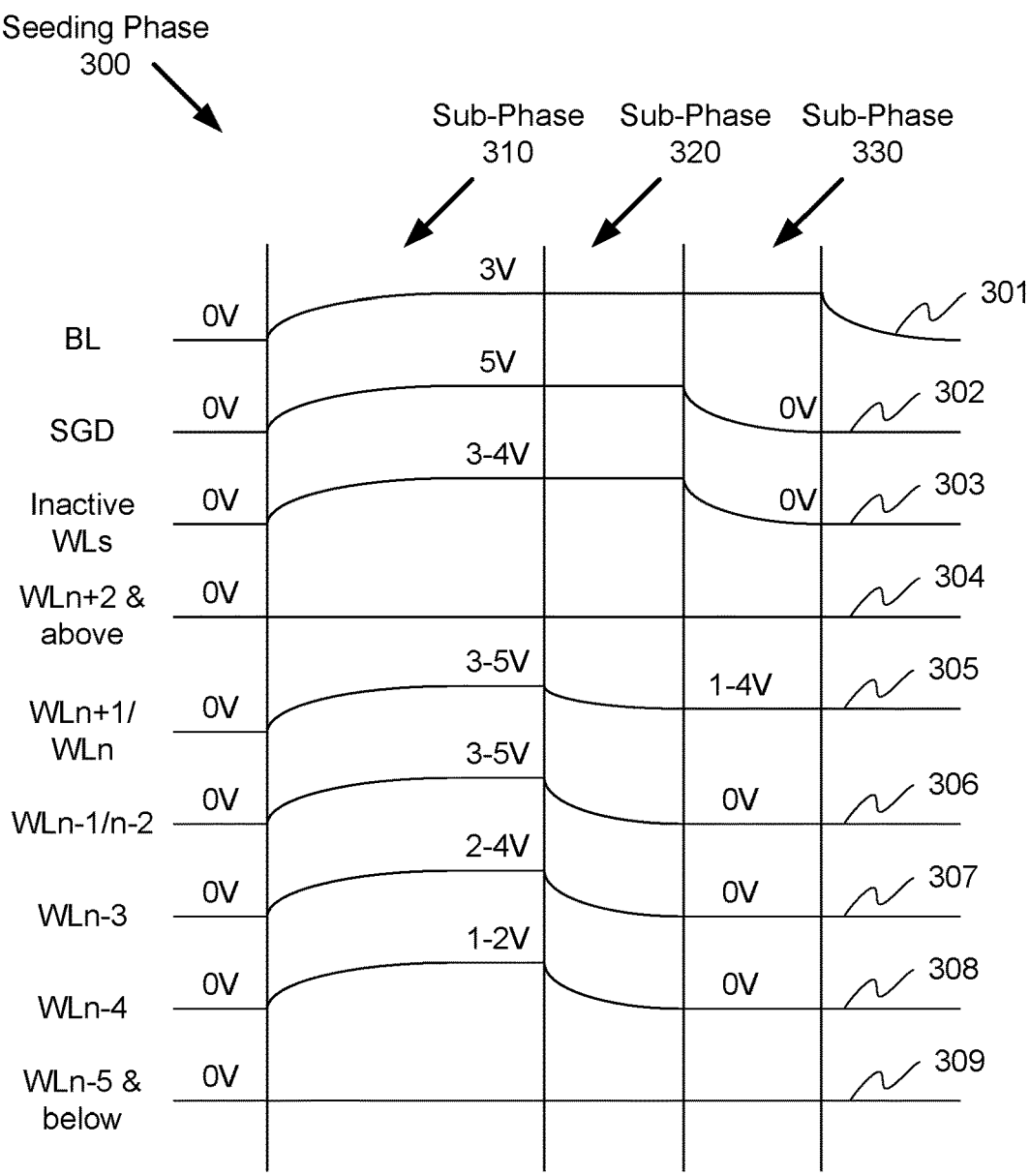
FIG. 3 is a timing diagram for operation of a memory device during a seeding phase of a program operation, in accordance with some embodiments of the present disclosure.

FIG. 3 is a timing diagram 300 for operation of a memory device during a seeding phase of a program operation, in accordance with some embodiments of the present disclosure. During a programming operation performed on a non-volatile memory device, such as memory device 130, certain phases can be encountered, including a seeding phase, which is typically followed by a program phase, and a program verify phase. The seeding phase generally includes global boosting of channel voltages of inhibited strings in the memory device 130 in an attempt to counteract program disturb resulting from the use of high voltage program pulses. During the subsequent phases, a pass voltage (Vpass) is applied to word lines of the memory device 130 in order to further boost the channel voltage of the associated channel, and a program voltage is applied to selected word lines (e.g., WLn) of the memory device 130, in order to program a certain level of charge to the selected memory cells on the word lines representative of a desired value.

Timing diagram 300 illustrates the various sub-phases of a seeding phase of a program operation, according to one embodiment. In this embodiment, different signals are applied to various devices in memory device 130 in each of the illustrated sub-phases. During sub-phase 310, program management component 113 causes a signal 301 having a seeding voltage (e.g., 3 volts) to be applied to the bit line 234 of the string 200. In one embodiment, program management component 113 sends a signal to the word line driver (or some other component) instructing that driver to apply signal 301 to the bit line 234. Signal 301 can remain at the seeding voltage throughout the seeding operation including all of sub-phases 310, 320, and 330. Following sub-phase 330, signal 301 returns to a ground voltage (e.g., 0V). During sub-phase 310, program management component 113 further causes signal 302 to be applied to the drain select gate 230 and signal 303 (e.g., 3-4V) to be applied to one or more inactive word lines (e.g., "dummy" word lines coupled to devices in string 200 that are not used to store data). Signal 302 (e.g., 5V) activates the drain select gate 230 (e.g., turns it "on") thereby allowing the seeding voltage to flow from bit line 234 through the drain select gate 230 to the various data word lines connected to string 200. In one embodiment, the data word lines include one or more word lines connected to the remaining memory cell(s) 212 of string 200. These cells 212 are generally used for storing data, such as data from host system 120. Signal 302 and signal 303 remain high during sub-phase 320, and program management component 113 causes signal 302 and signal 303 to return to a ground voltage during sub-phase 330. Thus, signal 302 and signal 303 are ramped down after a delay period (e.g., equivalent to the length of sub-phase 320) relative to when other signals (e.g., signals 305-307) are ramped down. In one embodiment, the length of the delay period is sufficient to allow those other signals to settle to at least one of an intermediate voltage (e.g., 1-4V) or a ground voltage before signal 302 and signal 303 are ramped down.

In one embodiment, program management component 113 causes a signal 304 with a ground voltage (i.e., 0V) to be applied to certain word lines of the string 200 during the seeding phase. For example, program management component 113 can cause signal 304 to be applied to word lines (WLn+2) and above, which are above a selected word line (WLn) in the string 200 throughout sub-phases 310, 320, and 330.

In one embodiment, program management component 113 can cause a positive voltage to be applied to certain word lines of the string 200 during the seeding phase, where the positive voltage can be seen at the control gates 250 of the corresponding memory cells 212. The positive voltage can reduce electron barriers at those certain word lines, allowing any residue electrons trapped on the source side to flow past the barriers and to the drain (i.e., bit line 234). As illustrated in timing diagram 300, during sub-phase 310 program management component 113 can cause a signal 305 with positive voltage (e.g., 3-5V) to be applied to a selected word line (i.e., the word line being programmed (WLn)) and at least one word line (WLn+1) above the selected word line in the string (i.e., a word line located between WLn and the drain select gate 230). This positive voltage ensures that the channel potential is mainly determined by the seeding voltage (e.g., 3V). This higher channel potential leads to a larger drain induced barrier lowering (DIBL) effect on the adjacent source-side word lines (i.e., the next word lines lower down the string (WLn-1 and WLn-2)), allowing more residue electrons to flow to the drain side. During sub-phase 320, program management component 113 causes signal 305 to ramp down to an intermediate voltage (e.g. 1-4V). This intermediate voltage can be any voltage less than the high voltage applied during sub-phase 310 and a ground voltage. In addition, program management component 113 can cause a signal 306 with a positive voltage (e.g., 3-5V) to be applied to the adjacent source side word lines (i.e., WLn-1 and WLn-2). This positive voltage can also reduce the electron barriers in these word lines. During sub-phase 320, program management component 113 causes signal 306 to ramp down to the ground voltage (e.g. 0V). In one embodiment, program management component 113 can cause different voltages to be applied to WLn-1 and WLn-2. For example, a higher voltage can be applied on WLn-1 and a lower voltage can be applied on WLn-2 since WLn-1 receives more threshold voltage reduction due to the DIBL effect than WLn-2. In another embodiment, the same voltage could be applied to WLn-1 and WLn-2, as well.

In one embodiment, program management component 113 can cause a signal 307 with a positive voltage (e.g., 2-4V) to be applied to the next source side word line (i.e., WLn-3) and a signal 308 with a positive voltage (e.g., 1-2V) to be applied to the next source side word line (i.e., WLn-4). These positive voltages can also reduce the electron barriers in these word lines. As illustrated, each subsequent voltage is lower than the previous voltage, such that the voltages step-down (i.e., get progressively closer to a ground voltage as the word lines are further away from the selected word line WLn) in order to smooth the potential gradient along the channel. During sub-phase 320, program management component 113 causes signal 307 and signal 308 to ramp down to the ground voltage (e.g. 0V). In one embodiment, program management component 113 causes a signal 309 with a ground voltage (i.e., 0V) to be applied to the remaining word lines (WLn-5 and below) in string 200 and to source select gate 220 throughout sub-phases 310, 320, and 330. It should be understood that the specific voltage levels described herein are merely examples, and that in other embodiments, different voltage levels can be used. In another embodiment, when programming occurs from the source-side to the drain-side the orientation of the sting as described above can be reversed such that the word line voltages are stepped down as the word lines are further away from the selected word line WLn and towards the drain.

Figure 4:
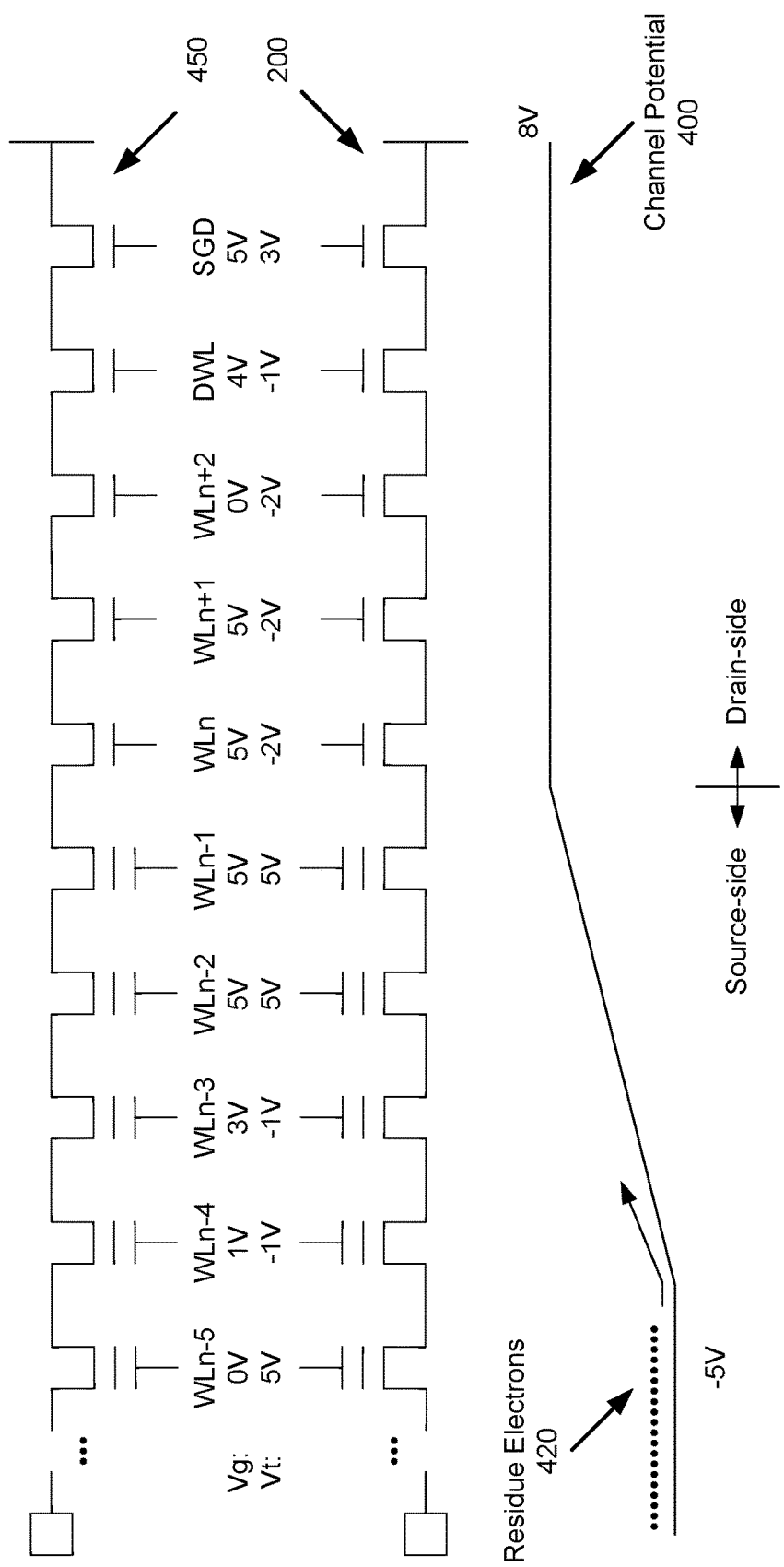
FIG. 4 is a diagram illustrating the channel potential for a string of memory cells during a seeding phase of a program operation, in accordance with some embodiments of the present disclosure.

FIG. 4 is a diagram illustrating the channel potential 400 for a string of memory cells during a seeding phase of a program operation, in accordance with some embodiments of the present disclosure. In one embodiment, the string 200 corresponds to string 200 illustrated in FIG. 2B and the seeding scheme used corresponds to timing diagram 300 illustrated in FIG. 3. As described above, the string 200 includes a drain select gate (SGD) device and a number of memory cells, each connected to a separate word line (WL). In one embodiment, one or more of the memory cells are connected to an inactive or "dummy" word line (DWL) and are generally not used for storing data. A least one of the memory cells in string 200 can be connected to a selected word line (i.e., the word line being programmed (WLn)) and each remaining memory cell on the source side of the selected word line can be connected to word lines ref erred to as data word lines (WLn-1, WLn-2, . . . ). In one embodiment, there can be one or more memory cells on the drain side of the selected word line connected to word lines (e.g., WLn+1, WLn+2, . . . ), which can be either dummy word lines or data word lines. Depending on the embodiment, there can be any number of data word lines. In one embodiment, string 200 represents an unselected sub-block of a data block of memory cells of memory device 130. As described above, the data block can include additional sub-blocks having additional strings of memory cells. For example, string 450 can represent a selected sub-block of the same data block, and can similarly include a number of memory cells and/or other devices which are coupled to the same word lines as the corresponding memory cells and/or other devices of string 200.

In one embodiment, each of the devices in string 200 has an associated threshold voltage (Vt) which represents a voltage at which each device switches from an "off" state to an "on" state, or vice versa. For example, the drain select gate device (SGD) can have a threshold voltage of 3V, the memory cells connected to the dummy word lines (DWL) can have a threshold voltage of -1V, WLn+2 and the selected word line WLn can have a threshold voltage of -2V, the memory cells connected to WLn-1 through WLn-4 can have a threshold voltage of between -2V to 5V, and the memory cell connected to WLn-5 can have a threshold voltage of 5V. In one embodiment, the channel potential 400 of the string 200 represents a difference between a voltage applied at the control gate of each device (i.e., a gate voltage (Vg)) and a representative threshold voltage. In one embodiment, there is a first representative threshold voltage on the drain-side of the selected word line (WLn) and a second representative threshold voltage on the source-side of the selected word line (WLn). Each representative threshold voltage can be the highest threshold voltage on the drain-side and the source-side, respectively. Thus, in the illustrated embodiment, the first representative threshold voltage on the drain-side can be the -2V associated with memory devices connected to WLn+2 and the second representative threshold voltage on the source-side can be the 5V associated with the memory devices connected to WLn-1 and WLn-2.

As described above with respect to FIG. 3, in one embodiment, program management component 113 can cause different voltage signals to be applied to the gate terminals of different devices during the seeding phase of a program operation. These voltage signals can be referred to as a respective gate voltage (Vg). As illustrated in FIG. 4, in one embodiment, program management component 113 can cause a positive voltage to be applied to certain word lines of the string 200 during the seeding phase, where the positive voltage can be seen at the control gates 250 of the corresponding memory cells 212. For example, program management component 113 can cause a first positive voltage (e.g., 5V) to be applied to the selected word line (i.e., WLn), at least one word line above the selected word line in the string (e.g., WLn+1), and at least one word line below the selected word line in the string (e.g., WLn-1, WLn-2). Program management component 113 can further cause a second positive voltage (e.g., 3V) to be applied to at least one data word line on the source-side (e.g., WLn-3) and a third positive voltage (e.g., 1V) to be applied to at least one additional data word line on the source-side (e.g., WLn-4). These positive voltages can reduce electron barriers at the corresponding memory cells, allowing any residue electrons 420 trapped on the source side to flow past the barriers and to the drain (i.e., bit line 234).

Figure 5:
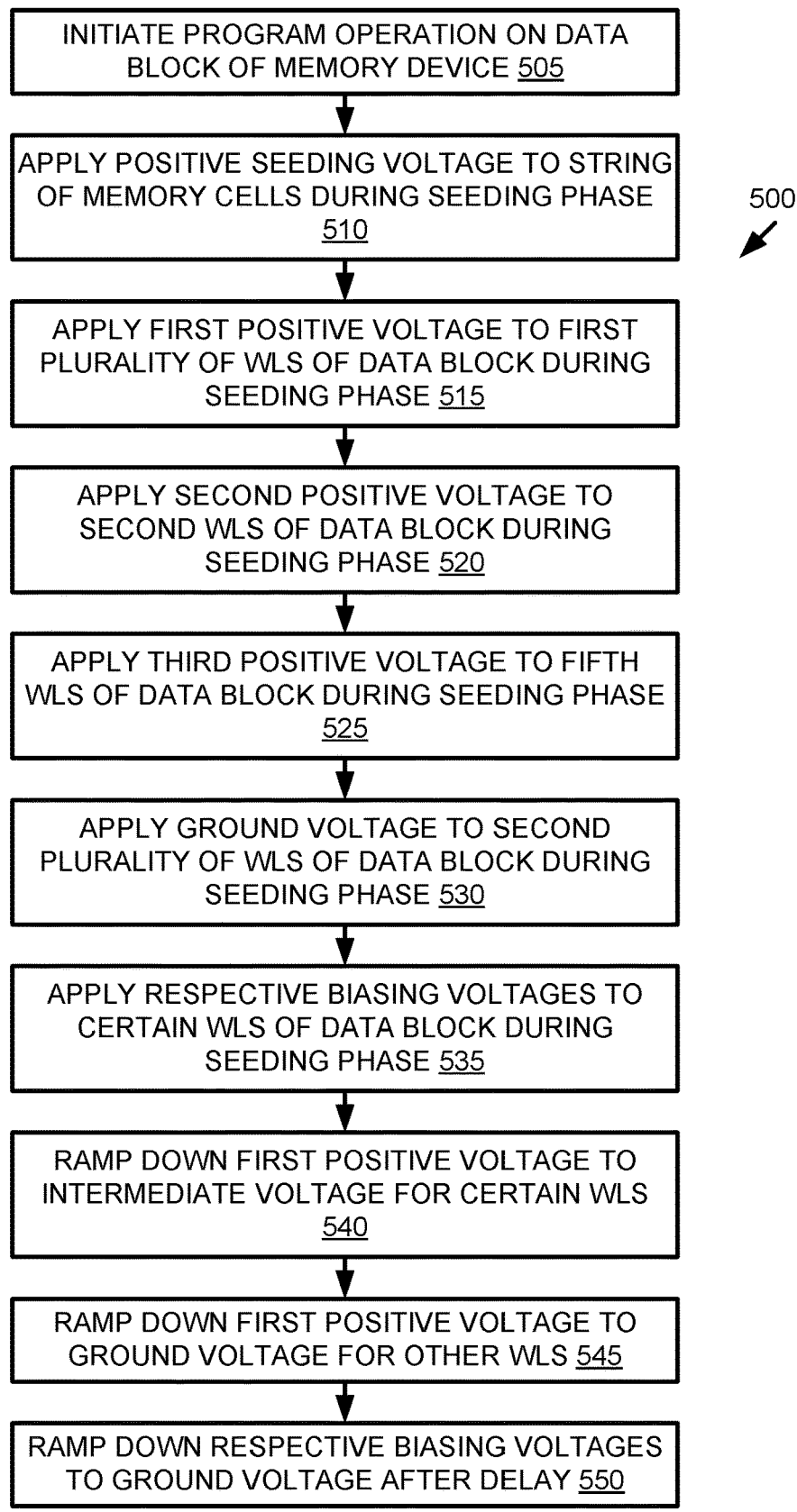
FIG. 5 is a flow diagram of an example method of implementing an enhanced gradient seeding scheme during a program operation in a memory sub-system, in accordance with some embodiments of the present disclosure.

FIG. 5 is a flow diagram of an example method of implementing an enhanced gradient seeding scheme during a program operation in a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by program management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a program operation is initiated. For example, the processing logic (e.g. processor 117 or local media controller 135) can initiate a program operation on a memory device (e.g., memory device 130). In one embodiment, the program operation includes a seeding phase, a program phase, and a program verify phase. In certain embodiments, each of these phases can be repeated numerous times in a cycle during a single programming operation. The seeding phase generally includes global boosting of channel voltages of inhibited strings in the memory device 130 in an attempt to counter-act program disturb resulting from the use of high voltage program pulses.

At operation 510, a seeding voltage is applied to a string of memory cells. For example, the processing logic can cause a seeding voltage to be applied to a string of memory cells in a data block of the memory device during the seeding phase of the program operation. During the seeding phase, program management component 113 causes a signal 301 having a seeding voltage (e.g., 3 volts) to be applied to the bit line 234 of the string 200. Signal 301 can remain at the seeding voltage throughout the seeding phase. In one embodiment, the seeding voltage is higher than that used in the seeding phases of other program operations in order to increase the channel potential of the string 200.

At operation 515, a positive voltage is applied to certain word lines. For example, the processing logic can cause a first positive voltage to be applied to a first plurality of word lines of the data block during the seeding phase, wherein each of the first plurality of word lines is coupled to a corresponding memory cell of a first plurality of memory cells in the string of memory cells, the first plurality of word lines comprising a selected word line associated with the program operation. In one embodiment, program management component 113 can cause the first positive voltage to be applied to certain word lines of the string 200 during the seeding phase, where the positive voltage can be seen at the control gates 250 of the corresponding memory cells 212. For example, in one embodiment, program management component 113 can cause the first positive voltage to be applied to third word lines (e.g., WLn+1) of the first plurality of word lines coupled to one or more of the first plurality of memory cells on a drain-side of the first memory cell in the string of memory cells, to the selected word line (i.e., WLn), and to one or more fourth word lines (e.g., WLn-1, and WLn-2) of the first plurality of word lines coupled to one or more of the first plurality of memory cells on a source-side of the first memory cell in the string of memory cells. The first positive voltage can reduce electron barriers at those word lines, allowing any residue electrons trapped on the source side to flow past the barriers and to the drain (i.e., bit line 234).

At operation 520, a positive voltage is applied to certain word lines. For example, the processing logic can cause a second positive voltage to be applied to one or more second word lines coupled to one or more second memory cells on a source-side of the first plurality of memory cells in the string of memory cells during the seeding phase, wherein the second positive voltage is less than the first positive voltage. In one embodiment, program management component 113 can cause the second positive voltage to be applied to certain word lines of the string 200 during the seeding phase, where the positive voltage can be seen at the control gates 250 of the corresponding memory cells 212. For example, in one embodiment, program management component 113 can cause the second positive voltage to be applied to the one or more second word lines (e.g., WLn-3). The second positive voltage can reduce electron barriers at those word lines, allowing any residue electrons trapped on the source side to flow past the barriers and to the drain (i.e., bit line 234), but since it is less than the first positive voltage, will smooth the potential gradient.

At operation 525, a positive voltage is applied to certain word lines. For example, the processing logic can cause a third positive voltage to be applied to one or more fifth word lines coupled to one or more third memory cells on the source-side of the one or more second memory cells in the string of memory cells during the seeding phase, wherein the third positive voltage is less than the second positive voltage. In one embodiment, program management component 113 can cause the third positive voltage to be applied to certain word lines of the string 200 during the seeding phase, where the positive voltage can be seen at the control gates 250 of the corresponding memory cells 212. For example, in one embodiment, program management component 113 can cause the third positive voltage to be applied to the one or more fifth word lines (e.g., WLn-4). The third positive voltage can reduce electron barriers at those word lines, allowing any residue electrons trapped on the source side to flow past the barriers and to the drain (i.e., bit line 234), but since it is less than the first and second positive voltages, will smooth the potential gradient.

At operation 530, a ground voltage is applied to certain word lines. For example, the processing logic can cause a ground voltage to be applied to a second plurality of word lines of the data block during the seeding phase, wherein each of the second plurality of word lines is coupled to a corresponding memory cell of a second plurality of memory cells in the string, wherein the second plurality of memory cells are adjacent to the one or more third memory cells on the source-side of the string of memory cells. In one embodiment, program management component 113 can cause the ground voltage to be applied to certain word lines of the string 200 during the seeding phase, where the positive voltage can be seen at the control gates 250 of the corresponding memory cells 212. For example, in one embodiment, program management component 113 can cause the ground voltage to be applied to the second plurality of word lines (e.g., WLn-5 and below).

At operation 535, respective biasing voltages are applied to certain word lines. For example, the processing logic can cause respective biasing voltages to be applied to word lines coupled to a select gate device and one or more inactive memory cells on a drain-side of the first plurality of memory cells in the string of memory cells during the seeding phase.

In one embodiment, program management component 113 can cause the respective biasing voltages to be applied to certain word lines of the string 200 during the seeding phase, where the positive voltage can be seen at the control gates 250 of the corresponding memory cells 212 or devices. For example, in one embodiment, program management component 113 can cause the respective biasing voltages to be applied to the word line coupled to the select gate device (SGD) and to any word lines coupled to inactive memory cells (e.g. the "dummy" word lines). Depending on the embodiment, the respective biasing voltages can have either the same or different values.

At operation 540, a voltage applied to certain word lines is ramped down. For example, the processing logic can cause the first positive voltage applied to the selected word line and applied to the one or more third word lines to ramp down to an intermediate voltage at an end of the seeding phase, wherein the intermediate voltage is less than the first positive voltage and greater than the ground voltage. In one embodiment, program management component 113 can cause the first positive voltage applied to certain word lines of the string 200 during the seeding phase to be ramped down to the intermediate voltage. For example, in one embodiment, program management component 113 can cause the first positive voltage to be applied to the selected word line (i.e., WLn) and to the one or more third word lines (e.g., WLn+1) to be ramped down to the intermediate voltage (e.g., 1-4V).

At operation 545, a voltage applied to certain word lines is ramped down. For example, the processing logic can cause the first positive voltage applied to the one or more fourth word lines, the second positive voltage applied to the one or more second word lines, and the third positive voltage applied to the one or more fifth word lines to ramp down to the ground voltage at the end of the seeding phase. In one embodiment, program management component 113 can cause the first positive voltage, the second positive voltage, and the third positive voltage applied to certain word lines of the string 200 during the seeding phase to be ramped down to the ground voltage. For example, in one embodiment, program management component 113 can cause the first positive voltage applied to the one or more fourth word lines (e.g., WLn-1 and WLn-2), the second positive voltage applied to the one or more second word lines (e.g., WLn-3), and the third positive voltage applied to the one or more fifth word lines (e.g., WLn-4) to be ramped down to the ground voltage (e.g., 0V).

At operation 550, a voltage applied to certain word lines is ramped down. For example, the processing logic can cause the respective biasing voltages applied to the word lines coupled to the select gate device and the one or more inactive memory cells to ramp down to the ground voltage after a delay period at the end of the seeding phase, wherein the delay period comprises a period of time after the first positive voltage, the second positive voltage, and the third positive voltage have been ramped down to at least one of the intermediate voltage or the ground voltage. In one embodiment, program management component 113 can cause the respective biasing voltages applied to certain word lines of the string 200 during the seeding phase to be ramped down to the ground voltage after the delay period. For example, in one embodiment, program management component 113 can cause the respective biasing voltages applied to the word line coupled to the select gate device (i.e., SGD) and the word lines applied to any inactive memory cells (e.g., "dummy word lines) to be ramped down to the ground voltage (e.g., 0V) after the delay period.

Figure 6:
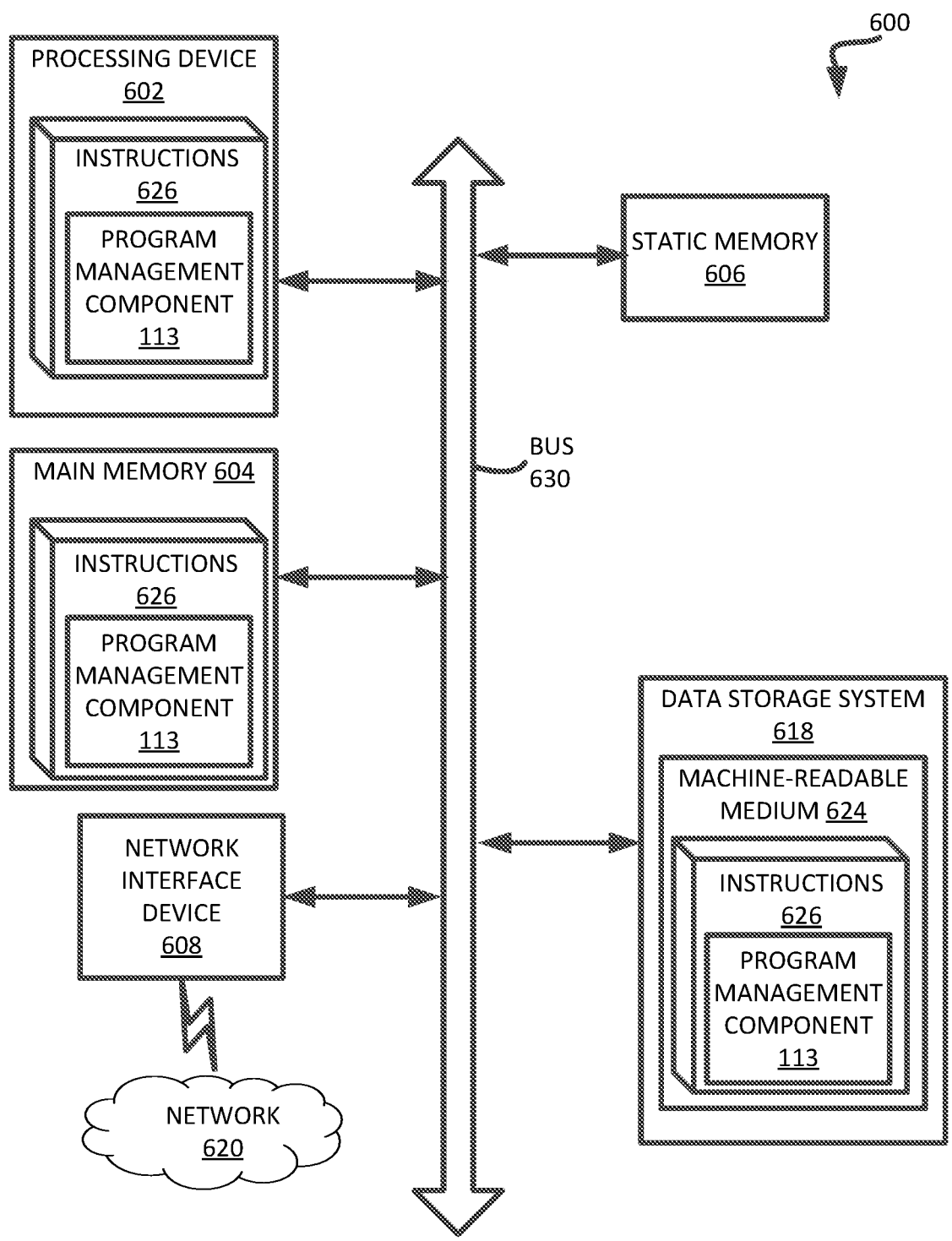
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the program management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium, such as a non-transitory computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the program management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array; and
control logic, operatively coupled with the memory array, to perform operations comprising:
causing a first positive voltage to be applied to a first plurality of word lines of a data block of the memory array during a seeding phase of a program operation, wherein each of the first plurality of word lines is coupled to a corresponding memory cell of a first plurality of memory cells in a string of memory cells, the first plurality of word lines comprising a selected word line associated with the program operation;
causing a second positive voltage to be applied to one or more second word lines coupled to one or more second memory cells on a source-side of the first plurality of memory cells in the string of memory cells during the seeding phase, wherein the second positive voltage is less than the first positive voltage; and
causing a third positive voltage to be applied to one or more third word lines coupled to one or more third memory cells on the source-side of the one or more second memory cells in the string of memory cells during the seeding phase, wherein the third positive voltage is less than the second positive voltage.

2. The memory device of claim 1, wherein the control logic is to perform operations further comprising:
causing a ground voltage to be applied to a second plurality of word lines of the data block during the seeding phase, wherein each of the second plurality of word lines is coupled to a corresponding memory cell of a second plurality of memory cells in the string, wherein the second plurality of memory cells are adjacent to the one or more third memory cells on the source-side of the string of memory cells.

3. The memory device of claim 1, wherein the selected word line is coupled to a first memory cell of the first plurality of memory cells, and wherein causing the first positive voltage to be applied to the first plurality of word lines of the data block comprises:
causing the first positive voltage to be applied to one or more fourth word lines of the first plurality of word lines coupled to one or more of the first plurality of memory cells on a drain-side of the first memory cell in the string of memory cells.

4. The memory device of claim 3, wherein causing the first positive voltage to be applied to the first plurality of word lines of the data block comprises:
causing the first positive voltage to be applied to one or more fifth word lines of the first plurality of word lines coupled to one or more of the first plurality of memory cells on a source-side of the first memory cell in the string of memory cells.

5. The memory device of claim 4, wherein the control logic is to perform operations further comprising:
causing respective biasing voltages to be applied to word lines coupled to a select gate device and one or more inactive memory cells on a drain-side of the first plurality of memory cells in the string of memory cells during the seeding phase.

6. The memory device of claim 5, wherein the control logic is to perform operations further comprising:
causing the first positive voltage applied to the selected word line and applied to the one or more fourth word lines to ramp down to an intermediate voltage at an end of the seeding phase, wherein the intermediate voltage is less than the first positive voltage and greater than a ground voltage; and
causing the first positive voltage applied to the one or more fifth word lines, the second positive voltage applied to the one or more second word lines, and the third positive voltage applied to the one or more third word lines to ramp down to the ground voltage at the end of the seeding phase.

7. The memory device of claim 6, wherein the control logic is to perform operations further comprising:
causing the respective biasing voltages applied to the word lines coupled to the select gate device and the one or more inactive memory cells to ramp down to the ground voltage after a delay period at the end of the seeding phase, wherein the delay period comprises a period of time after the first positive voltage, the second positive voltage, and the third positive voltage have been ramped down to at least one of the intermediate voltage or the ground voltage.

8. A method comprising:
causing a first positive voltage to be applied to a first plurality of word lines of a data block of a memory array of a memory device during a seeding phase of a program operation, wherein each of the first plurality of word lines is coupled to a corresponding memory cell of a first plurality of memory cells in a string of memory cells, the first plurality of word lines comprising a selected word line associated with the program operation;
causing a second positive voltage to be applied to one or more second word lines coupled to one or more second memory cells on a source-side of the first plurality of memory cells in the string of memory cells during the seeding phase, wherein the second positive voltage is less than the first positive voltage; and
causing a third positive voltage to be applied to one or more third word lines coupled to one or more third memory cells on the source-side of the one or more second memory cells in the string of memory cells during the seeding phase, wherein the third positive voltage is less than the second positive voltage.

9. The method of claim 8, further comprising:
causing a ground voltage to be applied to a second plurality of word lines of the data block during the seeding phase, wherein each of the second plurality of word lines is coupled to a corresponding memory cell of a second plurality of memory cells in the string, wherein the second plurality of memory cells are adjacent to the one or more third memory cells on the source-side of the string of memory cells.

10. The method of claim 8, wherein the selected word line is coupled to a first memory cell of the first plurality of memory cells, and wherein causing the first positive voltage to be applied to the first plurality of word lines of the data block comprises:
causing the first positive voltage to be applied to one or more fourth word lines of the first plurality of word lines coupled to one or more of the first plurality of memory cells on a drain-side of the first memory cell in the string of memory cells.

11. The method of claim 10, wherein causing the first positive voltage to be applied to the first plurality of word lines of the data block comprises:
causing the first positive voltage to be applied to one or more fifth word lines of the first plurality of word lines coupled to one or more of the first plurality of memory cells on a source-side of the first memory cell in the string of memory cells.

12. The method of claim 11, further comprising:
causing respective biasing voltages to be applied to word lines coupled to a select gate device and one or more inactive memory cells on a drain-side of the first plurality of memory cells in the string of memory cells during the seeding phase.

13. The method of claim 12, further comprising:
causing the first positive voltage applied to the selected word line and applied to the one or more fourth word lines to ramp down to an intermediate voltage at an end of the seeding phase, wherein the intermediate voltage is less than the first positive voltage and greater than a ground voltage; and
causing the first positive voltage applied to the one or more fifth word lines, the second positive voltage applied to the one or more second word lines, and the third positive voltage applied to the one or more third word lines to ramp down to the ground voltage at the end of the seeding phase.

14. The method of claim 13, further comprising:
causing the respective biasing voltages applied to the word lines coupled to the select gate device and the one or more inactive memory cells to ramp down to the ground voltage after a delay period at the end of the seeding phase, wherein the delay period comprises a period of time after the first positive voltage, the second positive voltage, and the third positive voltage have been ramped down to at least one of the intermediate voltage or the ground voltage.

15. A memory device comprising:
a memory array; and
control logic, operatively coupled with the memory array, to perform operations comprising:
causing a first positive voltage to be applied to a selected word line of a segment of the memory array during a seeding phase of a program operation, wherein the selected word line is coupled to a corresponding memory cell in a string of memory cells;

causing a second positive voltage to be applied to one or more second word lines coupled to one or more second memory cells on a source-side of the corresponding memory cell in the string of memory cells during the seeding phase, wherein the second positive voltage is less than the first positive voltage; and causing a third positive voltage to be applied to one or more third word lines coupled to one or more third memory cells on the source-side of the one or more second memory cells in the string of memory cells during the seeding phase, wherein the third positive voltage is less than the second positive voltage.

16. The memory device of claim 15, wherein the control logic is to perform operations further comprising:

causing a ground voltage to be applied to a second plurality of word lines of the segment during the seeding phase, wherein each of the second plurality of word lines is coupled to a corresponding memory cell of a second plurality of memory cells in the string, wherein the second plurality of memory cells are adjacent to the one or more third memory cells on the source-side of the string of memory cells.

17. The memory device of claim 15, wherein the control logic is to perform operations further comprising:

causing the first positive voltage to be applied to one or more fourth word lines coupled to one or more memory cells in the string of memory cells on a drain-side of the corresponding memory cell in the string of memory cells.

18. The memory device of claim 17, wherein the control logic is to perform operations further comprising:

causing the first positive voltage to be applied to one or more fifth word lines coupled to one or more memory cells in the string of memory cells on a source-side of the corresponding memory cell in the string of memory cells.

19. The memory device of claim 18, wherein the control logic is to perform operations further comprising:

causing respective biasing voltages to be applied to word lines coupled to a select gate device and one or more inactive memory cells on a drain-side of the corresponding memory cell in the string of memory cells during the seeding phase.

20. The memory device of claim 19, wherein the control logic is to perform operations further comprising:

causing the first positive voltage applied to the selected word line and applied to the one or more fourth word lines to ramp down to an intermediate voltage at an end of the seeding phase, wherein the intermediate voltage is less than the first positive voltage and greater than a ground voltage; and causing the first positive voltage applied to the one or more fifth word lines, the second positive voltage applied to the one or more second word lines, and the third positive voltage applied to the one or more third word lines to ramp down to the ground voltage at the end of the seeding phase.

* * * * *